US010310672B2

(12) United States Patent
Nakajima et al.

(10) Patent No.: US 10,310,672 B2
(45) Date of Patent: Jun. 4, 2019

(54) INPUT APPARATUS, INPUT DETECTION METHOD, AND IN-VEHICLE APPARATUS

(71) Applicant: Alps Alpine Co., Ltd., Tokyo (JP)

(72) Inventors: Satoshi Nakajima, Miyagi-ken (JP); Satoshi Hayasaka, Miyagi-ken (JP); Hiroshi Ishikawa, Miyagi-ken (JP); Toru Takahashi, Miyagi-ken (JP); Kohei Kitagawa, Miyagi-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 42 days.

(21) Appl. No.: 15/581,898

(22) Filed: Apr. 28, 2017

(65) Prior Publication Data
US 2017/0371488 A1    Dec. 28, 2017

(30) Foreign Application Priority Data

Jun. 27, 2016   (JP) .................. 2016-126882

(51) Int. Cl.
*G06F 3/041*   (2006.01)
*G06F 3/044*   (2006.01)
*H03K 17/96*   (2006.01)

(52) U.S. Cl.
CPC ............ *G06F 3/0418* (2013.01); *G06F 3/044* (2013.01); *H03K 17/9622* (2013.01); *G06F 2203/04108* (2013.01); *H03K 2217/960705* (2013.01)

(58) Field of Classification Search
CPC .................. G06F 3/0418; G06F 3/044; G06F 2203/04108; H03K 17/9622; H03K 2217/960705

See application file for complete search history.

(56) References Cited

U.S. PATENT DOCUMENTS

| | | | |
|---|---|---|---|
| 9,423,427 B2 * | 8/2016 | Maharyta | ........... G01R 27/2605 |
| 2004/0008129 A1 | 1/2004 | Philipp | |
| 2008/0246723 A1 | 10/2008 | Baumbach | |
| 2011/0175551 A1 | 7/2011 | Wood et al. | |

FOREIGN PATENT DOCUMENTS

| | | |
|---|---|---|
| EP | 1381160 A1 | 1/2004 |
| JP | 2014-197763 | 3/2013 |
| WO | 2010/017481 A2 | 2/2010 |

* cited by examiner

*Primary Examiner* — Nelson M Rosario
(74) *Attorney, Agent, or Firm* — Beyer Law Group LLP

(57) ABSTRACT

An input apparatus includes a plurality of electrodes spaced apart from each other, a signal processing unit configured to output an input signal depending on a change in a capacitance of each electrode, and a determination unit configured to determine whether an operation object comes in a proximity of at least one of electrodes based on input signals output from the signal processing unit. The determination unit makes a determination such that in a case where one of the input signals is greater than or equal to a first threshold value and an integral value of another of the plurality of input signals in a predetermined integration period is greater than or equal to a second threshold value, it is determined that an operation object has come in a proximity of an electrode corresponding to the one of the input signals.

4 Claims, 10 Drawing Sheets

FIG. 12

| ERRONEOUS DETECTION AVOIDANCE RATE | 82% | 91% | 91% | 100% |
|---|---|---|---|---|
| TH2 | 5 | 10 | 15 | 20 |
| 1 | 120 | 200 | 300 | 400 |
| 2 | 120 | 120 | 160 | 200 |
| 3 | 120 | 120 | 120 | 140 |
| 4 | 120 | 120 | 120 | 120 |
| 5 | 120 | 120 | 120 | 120 |
| 6 | 120 | 120 | 120 | 120 |
| 7 | 120 | 120 | 120 | 120 |
| 8 | 120 | 120 | 120 | 120 |
| 9 | 120 | 120 | 120 | 120 |

Unit: ms

INPUT APPARATUS, INPUT DETECTION METHOD, AND IN-VEHICLE APPARATUS

CLAIM OF PRIORITY

This application claims benefit of Japanese Patent Application No. 2016-126882 filed on Jun. 27, 2016, which is hereby incorporated by reference.

BACKGROUND OF THE INVENTION

1. Field of the Invention

The present invention relates to an input apparatus, an input detection method, and an in-vehicle apparatus.

2. Description of the Related Art

A capacitive input apparatus is used in a wide variety of fields. In a capacitive input apparatus, an input operation is performed by detecting a change in capacitance that occurs when an operation object such as a finger of an operator, a touch pen, or the like is brought in the proximity of the input apparatus. A change in capacitance can also occur owing to external noise in a usage environment. For example, in the case of a capacitive input apparatus disposed on an in-vehicle apparatus, there is a possibility that the input apparatus may receive noise due to an external factor such as vibrations of a vehicle body. Therefore, it is necessary to distinguish between a change in capacitance caused by an actual operation and a change in capacitance caused by noise to reduce an erroneous detection due to noise.

For example, Japanese Unexamined Patent Application Publication No. 2014-197763 discloses a capacitive touch sensor including a plurality of detection units, pulse output means configured to apply a pulse signal and an inverted pulse signal, and an integral operation unit configured to integrate an amplified output obtained by amplifying an induced voltage output occurring owing to a change in capacitance and an inverted output of the amplified output such that the amplified output and the inverted output are alternately selected and integrated in synchronization with the pulse signal and the inverted pulse signal, wherein in a case where an integration output is higher than or equal to a positive first threshold value or lower than or equal to a negative second threshold value, it is detected that a human body has come in the proximity of the touch sensor.

SUMMARY OF THE INVENTION

In the capacitive touch sensor disclosed in Japanese Unexamined Patent Application Publication No. 2014-197763, a pulse generation circuit for applying a pulse signal and an inverted pulse signal is needed to be provided in each of the plurality of detection units. This results in an increase in complexity of a circuit configuration.

In view of the above, the present invention provides an input apparatus, an input detection method, and an in-vehicle apparatus, configured in a simple manner to be capable of reducing an erroneous detection.

The present invention provides an input apparatus including a plurality of electrodes disposed so as to be spaced apart from each other, a signal processing unit configured to output an input signal depending on a change in capacitance of each electrode, and a determination unit configured to determine whether an operation object has come in a proximity of at least one of electrodes based on a plurality of input signals output from the signal processing unit, the determination unit being configured to make a determination such that in a case where one of the input signals is greater than or equal to a predetermined first threshold value and an integral value of another of the plurality of input signals in a predetermined integration period is greater than or equal to a predetermined second threshold value, the determination unit determines that an operation object has come in a proximity of an electrode corresponding to the input signal greater than or equal to the first threshold value.

In the input apparatus according to the present invention, an input signal based on capacitance of each electrode is generated by the signal processing unit and output to the determination unit. The determination unit makes a determination such that in a case where one of the input signals is greater than or equal to the predetermined first threshold value and the integral value of another of the input signals in the predetermined integration period is greater than or equal to the predetermined second threshold value, the determination unit determines that an operation object has come in a proximity of an electrode corresponding to the input signal greater than or equal to the first threshold value. As described above, in the determination as to whether an operation object has come in the proximity of the input apparatus, not only a change in capacitance that occurs in one electrode, but a change in capacitance of other electrodes disposed adjacent to the one electrode is taken into account, and thus it becomes possible to reduce an erroneous detection due to noise. The distance between adjacent electrodes may be set, for example, in a range from 15 millimeters (inclusive) to 40 millimeters (inclusive).

In the input apparatus described above, the determination unit may include a plurality of come-in-proximity determination units respectively corresponding to the plurality of electrodes, and each come-in-proximity determination unit may include a first determination unit configured to determine whether a first input signal given as an input signal to a corresponding electrode is greater than or equal to the first threshold value, an integral operation unit configured to integrate the input signal of another of the other electrodes in the integration period, and a second determination unit configured to make a determination such that when the first determination unit determines that the first input signal is greater than or equal to the first threshold value, in a case where a result of the integration performed by the integral operation unit is greater than or equal to the second threshold value, the second determination unit determines that an operation object has come in a proximity of the corresponding electrode.

In the input apparatus described above, the integral operation unit may continuously perform the integration in the integration period regardless of whether or not the first input signal is greater than or equal to the first threshold value.

In the input apparatus configured in the above-described manner, the integral operation unit continuously performs the integration in the integration period regardless of whether or not the first input signal is greater than or equal to the first threshold value. Therefore, for example, when the first input signal is detected to be greater than or equal to the first threshold value, the integration had been started before the detection. This makes it possible to reduce the period of determining whether an operation object has come in the proximity of the input apparatus.

The present invention provides an in-vehicle apparatus including the input apparatus described above.

The present invention provides a method of, in an input apparatus including a plurality of electrodes disposed so as to be spaced apart from each other, detecting inputting, including outputting an input signal depending on a change in capacitance of each electrode, and detecting an inputting operation on an electrode such that in a case where one of the input signals is greater than or equal to a predetermined first threshold value and an integral value of another of the other input signals in a predetermined integration period is greater than or equal to a predetermined second threshold value, it is determined that an inputting operation is performed on an electrode corresponding to the input signal greater than or equal to the first threshold value.

BRIEF DESCRIPTION OF THE DRAWINGS

FIG. 12 is a diagram illustrating erroneous detection avoidance rates in an input detection process according to an embodiment, for various values of a second threshold value and various integration periods in which an adjacent signal value is integrated.

DESCRIPTION OF THE PREFERRED EMBODIMENTS

An input apparatus, an input detection method, and an in-vehicle apparatus according to embodiments of the present invention are described below with reference to drawings. In embodiments described below, it is assumed by way of example that an input apparatus using a capacitive sensor is used as an operation button of an in-vehicle apparatus such as a center console. However, the in-vehicle apparatus, to which the input apparatus of the present invention is applied, is not limited to such an in-vehicle apparatus, but the input apparatus according to the present invention may be used in a wide variety of fields, for example, a communication terminal such as a portable telephone apparatus or the like, or other electronic devices.

Figure 1:
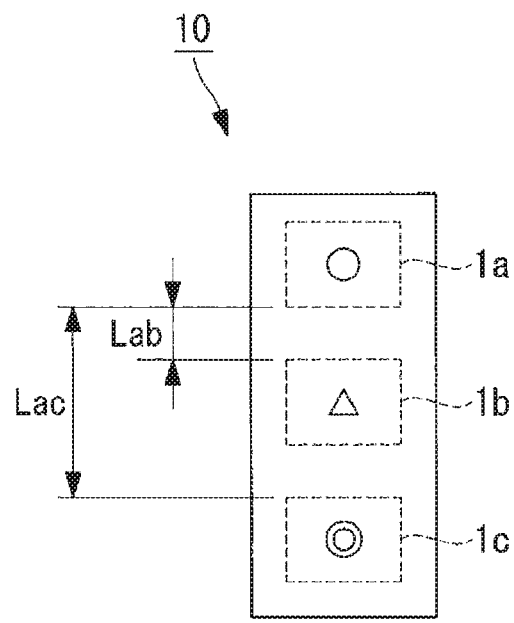
FIG. 1 is a diagram illustrating a layout of electrodes included in an input apparatus according to an embodiment of the present invention.
Figure 2:
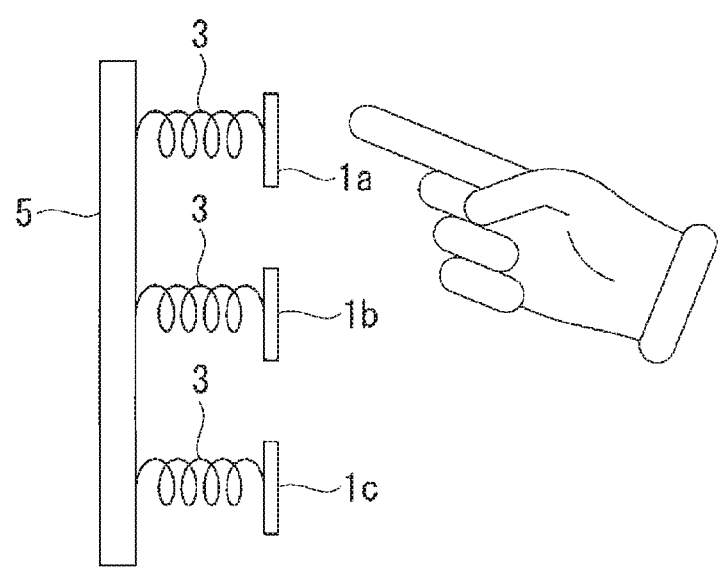
FIG. 2 is a diagram illustrating an example of a structure of attaching electrodes shown in FIG. 1.

FIG. 1 is a diagram illustrating a layout of electrodes included in an input apparatus according to an embodiment of the present invention, and FIG. 2 is a diagram illustrating an example of a structure of attaching electrodes. As shown in FIGS. 1 and 2, the input apparatus 10 includes a plurality of electrodes $1a$, $1b$, and $1c$ disposed so as to be spaced apart from each other. For example, the electrodes $1a$, $1b$, and $1c$ are respectively disposed so as to correspond to operation buttons (operation input units) such as a hazard switch, a wiper operation switch, an air conditioner switch, or the like for operating various in-vehicle devices.

For example, each of the electrodes $1a$, $1b$, and $1c$ is connected to a substrate 5 via a spring 3 as shown in FIG. 2. Thus in this state in which the electrodes $1a$, $1b$, and $1c$ are each pressed against the substrate 5 by a spring pressure of the spring 3, a contact resistance occurs between each of the electrodes $1a$, $1b$, and $1c$ and the corresponding one of the springs 3. In a case where the spring pressure is high enough, the electrodes $1a$, $1b$, and $1c$ do not substantially receive an influence of vibrations from a vehicle. However, in a case where the spring pressure is low, when a shock such as a vibration of the vehicle is received, a deviation occurs in relative position between the electrodes $1a$, $1b$, and $1c$ and corresponding springs 3, and thus a change in a contact resistance occurs. A change in contact resistance may cause a change in capacitance, which may result in a detection error. The input apparatus 10 according to the present embodiment is capable of reducing such erroneous detections due to noise in a usage environment. A distance such as Lab, Lac, or the like between adjacent electrodes is set to a value in a range, for example, from about 15 millimeters to about 40 millimeters.

Figure 3:
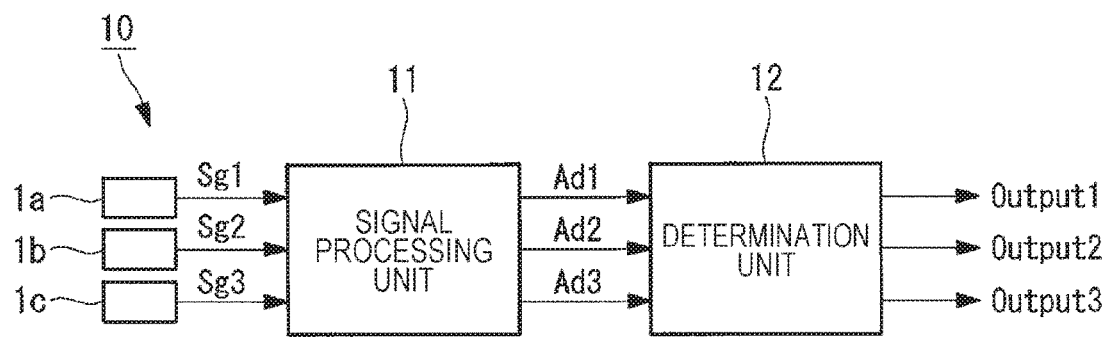
FIG. 3 is a diagram illustrating an outline of a configuration of an input apparatus according to an embodiment of the present invention.

FIG. 3 is a diagram illustrating an outline of a configuration of the input apparatus 10 according to an embodiment of the present invention. As shown in FIG. 3, the input apparatus 10 includes a signal processing unit 11 and a determination unit 12. The signal processing unit 11 outputs input signals Ad1, Ad2, and Ad3 corresponding to changes in capacitance of respective electrodes $1a$, $1b$, and $1c$, and the determination unit 12 determines whether an operation object has come in the proximity of the electrodes $1a$, $1b$, and $1c$ based on the input signals Ad1, Ad2, and Ad3 output from the signal processing unit 11. The signal processing unit 11 and the determination unit 12 are disposed on the substrate shown in FIG. 1.

Figure 4:
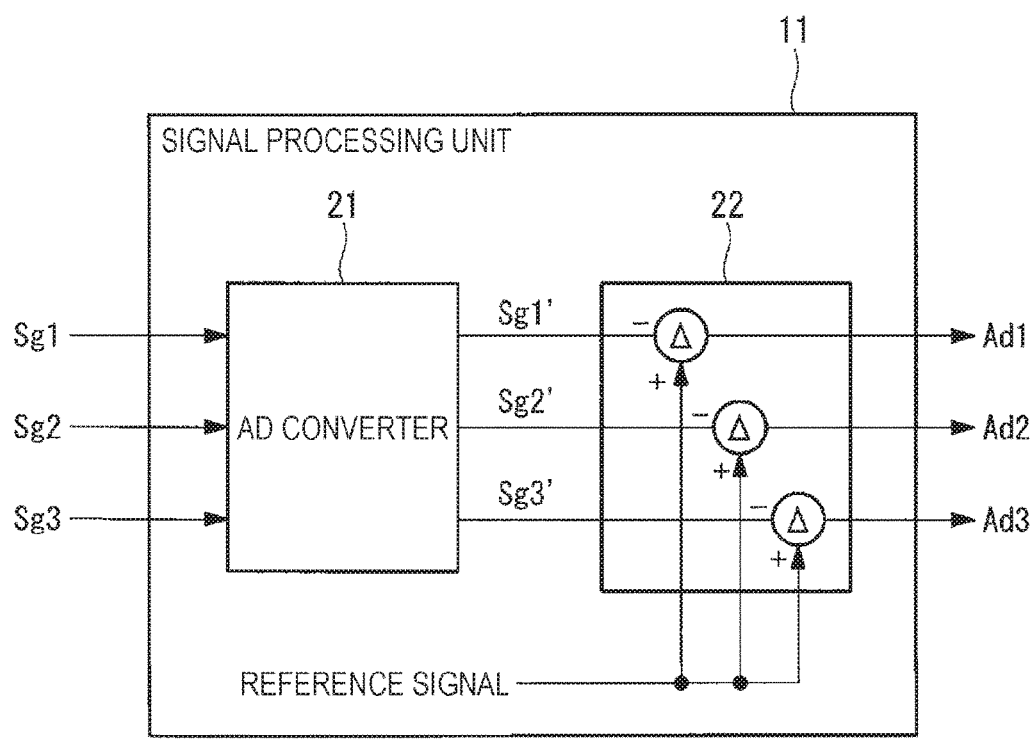
FIG. 4 is a functional block diagram of a signal processing unit shown in FIG. 3.

The signal processing unit 11 includes an analog-to-digital converter 21 and a subtractor 22 as shown, for example, in FIG. 4. In the signal processing unit 11, analog signals Sg1, Sg2, and Sg3 output from the respective electrodes $1a$, $1b$, and $1c$ are converted to digital signals Sg1', Sg2', and Sg3' by the analog-to-digital converter 21. The digital signals Sg1', Sg2', and Sg3' are input to the subtractor 22. In the subtractor 22, differences between the respective digital signals Sg1', Sg2', and Sg3' and a preset reference signal are calculated, and input signals Ad1, Ad2, and Ad3 with digital values corresponding to the calculated differences are output. Note that the signal processing unit 11 may include an amplifier (not illustrated) that amplifies the signals output from the analog-to-digital converter 21 or the subtractor 22 and outputs the amplified signals.

The determination unit 12 may be, for example, a microcomputer including a CPU, a read only memory (ROM) for storing one or more programs or the like executed by the CPU, a random access memory (RAM) functioning as a work area in execution of each program, and the like. Various below-described processes performed by various units are realized by the CPU by loading various programs stored in the ROM into the RAM and executing them. Note that the signal processing unit 11 may be included in the microcomputer.

The determination unit 12 makes a determination such that in a case where one of the input signals (for example, the input signal Ad1) is greater than or equal to a predetermined first threshold value and an integral value of another of the input signals (for example, the input signals Ad2 and Ad3) in a predetermined integration period is greater than or equal to a predetermined second threshold value, the determination unit 12 determines that an operation object has come in a proximity of an electrode (for example, the electrode 1a) corresponding to the input signal (for example, the input signal Ad1) greater than or equal to the first threshold value.

Figure 5:
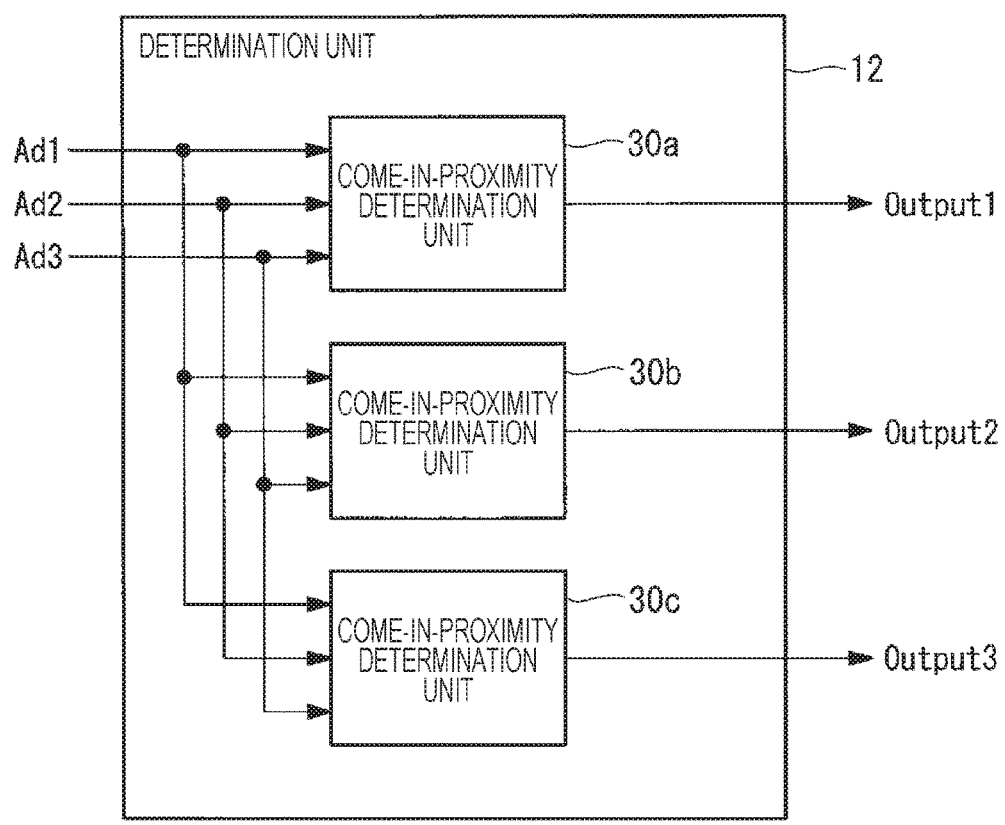
FIG. 5 is a functional block diagram of a determination unit shown in FIG. 3.

More specifically, the determination unit 12 includes come-in-proximity determination units 30a, 30b, and 30c corresponding to the respective electrode 1a, 1b, and 1c as shown in FIG. 5. Hereinafter, an electrode of interest in the electrode 1a, 1b, and 1c corresponding to the respective come-in-proximity determination units 30a, 30b, and 30c will be referred to as a "main electrode", and other electrodes located adjacent to the main electrode will be referred to as "adjacent electrodes".

The come-in-proximity determination unit 30a makes a determination, using the input signal Ad1 of the main electrode 1a and the input signals Ad2 and Ad3 of the adjacent electrodes 1b and 1c, as to whether an operation object has come in the proximity of the main electrode 1a, and the come-in-proximity determination unit 30a outputs a determination result Output1. The come-in-proximity determination unit 30b makes a determination, using the input signal Ad2 of the main electrode 1b and the input signals Ad3 and Ad1 of the adjacent electrodes 1c and 1a, as to whether an operation object has come in the proximity of the main electrode 1b, and the come-in-proximity determination unit 30b outputs a determination result Output2. The come-in-proximity determination unit 30c makes a determination, using the input signal Ad3 of the main electrode 1c and the input signals Ad1 and Ad2 of the adjacent electrodes 1a and 1b, as to whether an operation object has come in the proximity of the main electrode 1c, and the come-in-proximity determination unit 30c outputs a determination result Output3.

Figure 6:
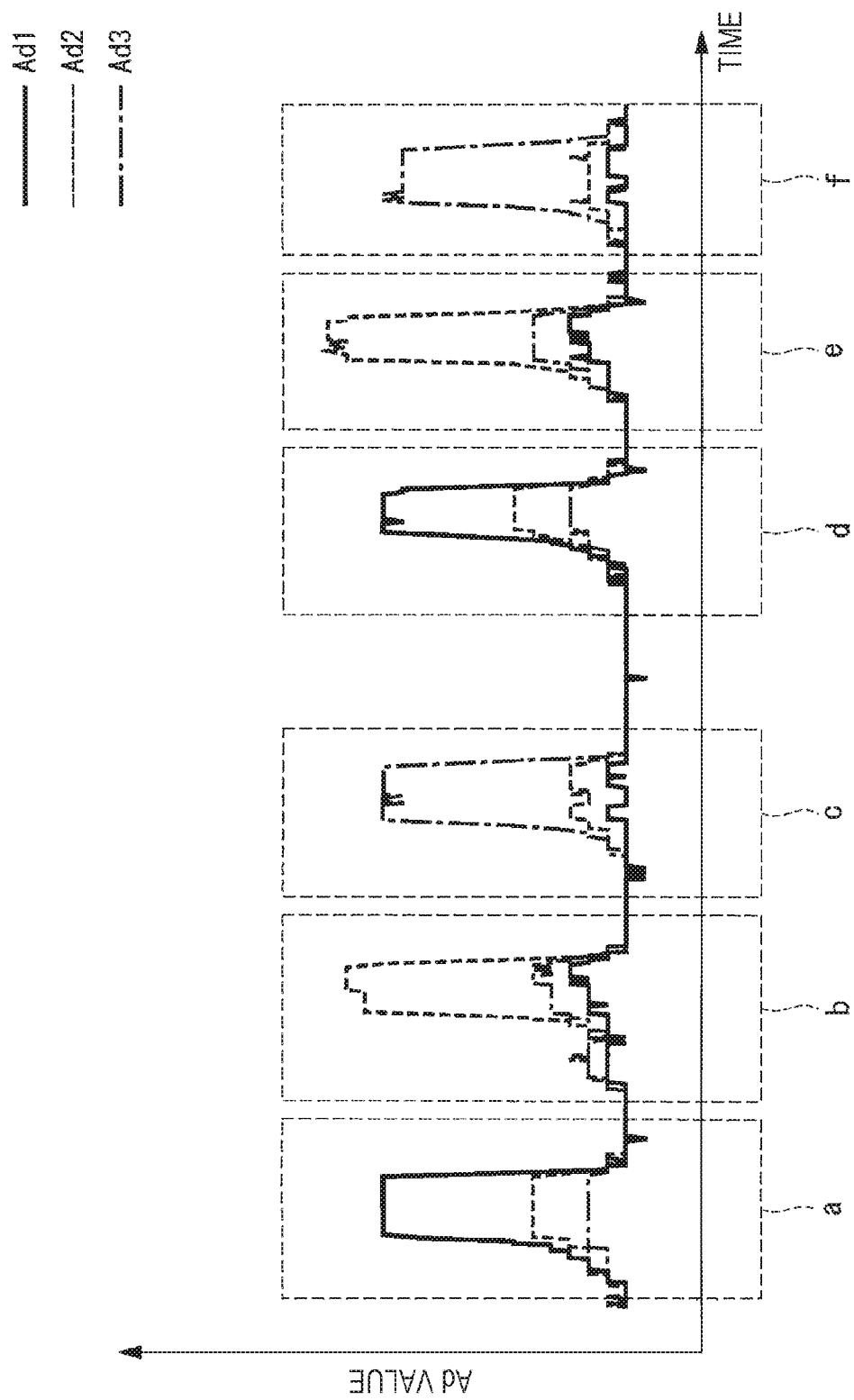
FIG. 6 is a diagram illustrating an example of a waveform of an input signal applied to each electrode for a case where an operation object comes in the proximity of one of electrodes shown in FIG. 2.

In a case where an operation object has come in the proximity of one of electrodes, for example, the electrode 1a, a change in capacitance of the electrode 1a occurs, and a change in capacitance also occurs in the adjacent electrodes 1b and 1c located adjacent to the electrode 1a. FIG. 6 illustrates waveforms of the input signals Ad1, Ad2, and Ad3 of the electrodes 1a, 1b, and 1c by way of example for a case where an operation object (for example, a tip of a human finger) comes in the proximity of one of the electrodes. In FIG. 6, waveforms a and d represent waveforms that may occur when a tip of a human finger comes in the proximity of the electrode 1a. Waveforms b and e represent waveforms that may occur when a tip of a human finger comes in the proximity of the electrode 1b. Waveforms c and f represent waveforms that may occur when a tip of a human finger comes in the proximity of the electrode 1c. As shown in FIG. 6, in a case where a tip of a finger comes in the proximity of one of electrodes, a change in capacitance occurs not only in this electrode but adjacent electrodes. On the other hand, in the case of a change in capacitance due to noise such as a vibration or the like in a usage environment, even when a change in capacitance occurs in one of the electrodes, no change in capacitance occurs in adjacent electrodes. Therefore, taking into account the change in capacitance in adjacent electrodes makes it possible to easily determine whether a change in capacitance is caused by an operation object approaching or noise.

Figure 7:
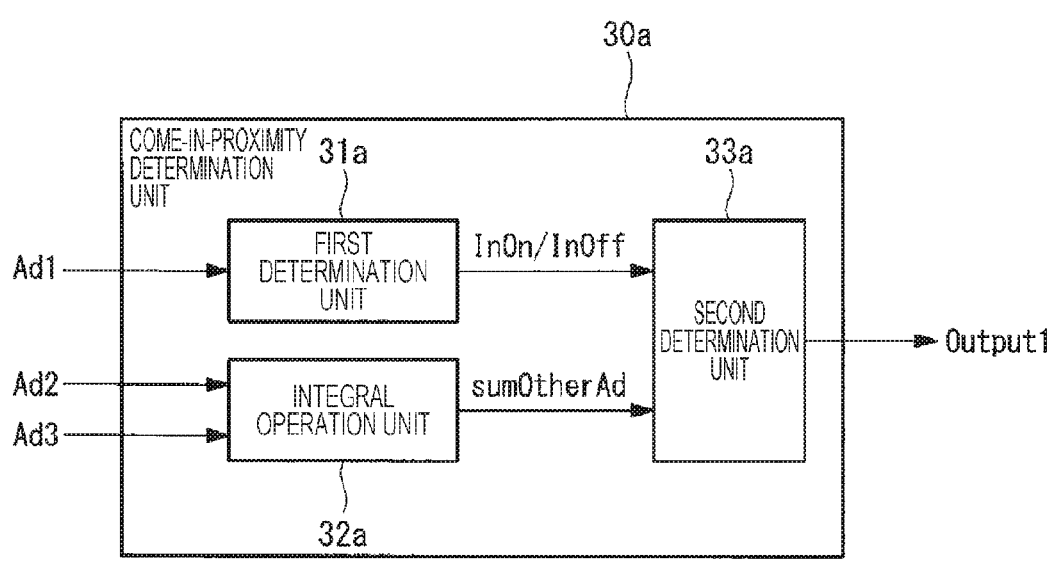
FIG. 7 is a functional block diagram illustrating functions of a come-in-proximity determination unit shown in FIG. 5.

FIG. 7 is a functional block diagram illustrating functions of the come-in-proximity determination unit 30a. Note that the come-in-proximity determination units 30b and 30c each also have a similar configuration and functions, although the following description with reference to FIG. 7 is given representatively only for come-in-proximity determination unit 30a, and descriptions of the come-in-proximity determination units 30b and 30c are omitted.

As shown in FIG. 7, the come-in-proximity determination unit 30a includes a first determination unit 31a, an integral operation unit 32a, and a second determination unit 33a. The first determination unit 31a determines whether the input signal Ad1 of the main electrode 1a is greater than or equal to a preset first threshold value TH1. The integral operation unit 32a integrates the input signals Ad2 and Ad3 of the adjacent electrodes 1b and 1c over a predetermined integration period. The second determination unit 33a makes a determination such that in a case where the first determination unit 31a determines that the input signal Ad1 of the main electrode 1a is greater than or equal to the first threshold value TH1 and an integration result calculated by the integral operation unit 32a is greater than or equal to the second threshold value TH2, the second determination unit 33a determines that an operation object has come in the proximity of the main electrode 1a. Note that, as described in further detail later, the integral operation unit 32a continuously performs the integration of the input signals of the adjacent electrodes 1b and 1c in the predetermined integration period regardless of whether or not the first determination unit 31a determines that the input signal of the main electrode 1a is greater than or equal to the first threshold value TH1.

Figure 8:
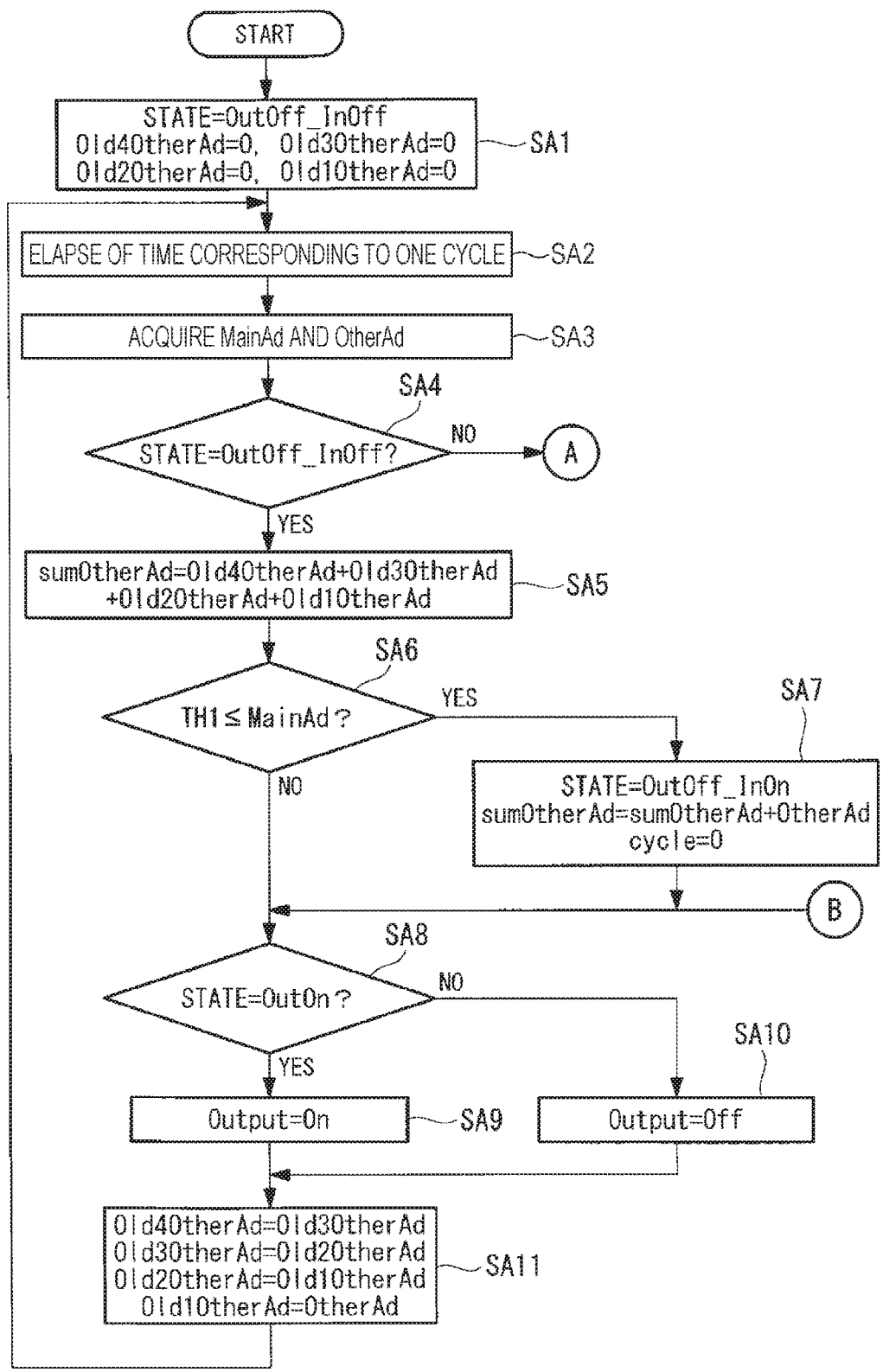
FIG. 8 is a flow chart illustrating a procedure of an input detection process performed by the come-in-proximity determination unit shown in FIG. 5.
Figure 9:
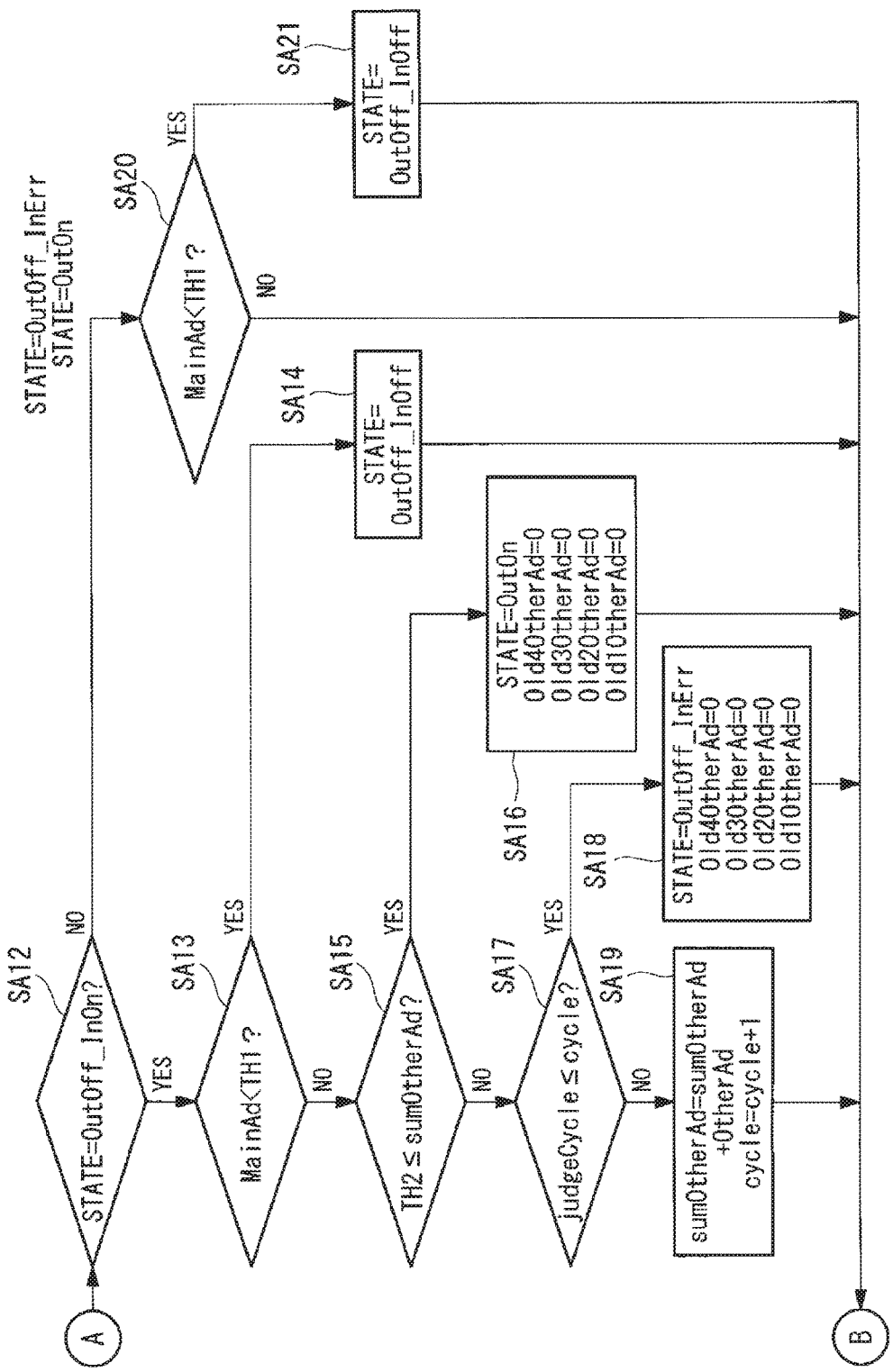
FIG. 9 is a flow chart illustrating a procedure of an input detection process performed by the come-in-proximity determination unit shown in FIG. 5.

Next, a process performed by the come-in-proximity determination units 30a, 30b, and 30c is described below with reference to FIG. 8 and FIG. 9. FIG. 8 and FIG. 9 are flow charts illustrating a procedure of an input detection process performed by the come-in-proximity determination units 30a, 30b, and 30c.

In the input detection process described below, a main signal value "MainAd" is a signal value of the input signal Ad of the main electrode, an adjacent signal value "OtherAd" is the sum of the signal values of the input signals of the adjacent electrode, and an adjacent integration value "sumOtherAd" is the integral value of the adjacent signal value.

For example, in a case where the process is performed by the come-in-proximity determination unit 30a, the main signal value "MainAd" is the signal value of the input signal Ad1 of the electrode 1a, and the adjacent signal value "OtherAd" is the sum of the signal values of the input signals Ad2 and Ad3 of the adjacent electrodes 1b and 1c. In a case where the process is performed by the come-in-proximity determination unit 30b, the main signal value "MainAd" is the signal value of the input signal Ad2 of the electrode 1b, and the adjacent signal value "OtherAd" is the sum of the signal values of the input signals Ad3 and Ad1 of the adjacent electrodes 1c and 1a. In a case where the process is performed by the come-in-proximity determination unit 30c, the main signal value "MainAd" is the signal value of the input signal Ad3 of the electrode 1c, and the adjacent signal value "OtherAd" is the sum of the signal values of the input signals Ad1 and Ad2 of the adjacent electrodes 1a and 1b.

A come-in-proximity determination process described below is started, for example, when the power of the input apparatus 10 in an off-state is turned on.

First, in step SA1, initial setting is performed. In the initial setting, a status is set to "OutOff_InOff". Furthermore, 4-cycles-before adjacent signal value "Old4OtherAd", 3-cycles-before adjacent signal value "Old3OtherAd" 2-cycles-before adjacent signal value "Old2OtherAd", and 1-cycle-before adjacent signal value "Old1OtherAd" are all set to 0. In the status "OutOff_InOff", "OutOff" indicates that the output is in an off-state, that is, "OutOff" indicates that no operation object is in the proximity, and "InOff" indicates that the main signal value "MainAd" is lower than the first threshold value TH1.

When 1 cycle (for example, 10 milliseconds) elapses (step SA2), the main signal value "MainAd" and the adjacent signal value "OtherAd" are acquired (step SA3). Next, a determination is performed as to whether the current status is "OutOff_InOff" (step SA4). In a case where it is determined that the current status is "OutOff_InOff", the processing flow proceeds to step SA5 in which an adjacent integration value "sumOtherAd" is determined by integrating the adjacent signal value over a period of 4 cycles. Next, in step SA6, a determination is performed as to whether or not the main signal value "MainAd" is greater than or equal to the first threshold value TH1. If the determination is "YES", the processing flow proceeds to step SA7 in which the status is changed to "OutOff_InOn", the adjacent signal value "OtherAd" is added to the adjacent integration value "sumOtherAd", and the cycle value "Cycle" is set to 0. Thereafter, the processing flow proceeds to step SA8.

On the other hand, in a case where the determination in step SA6 is that the main signal value "MainAd" is smaller than the first threshold value TH1, the processing flow directly proceeds to step SA8. In step SA8, a determination is performed as to whether the current status is "OutOn". In a case where it is determined that the current status is "OutOff", the processing flow proceeds to step SA10, in which the output is set as "Output=Off". However, in a case where it is determined that current status is "OutOn", the processing flow proceeds to step SA9, in which the output is set as "Output=On".

Subsequently, in step SA11, the adjacent signal values are updated. More specifically, the 3-cycles-before adjacent signal value "Old3OtherAd" is substituted in the 4-cycles-before adjacent signal value "Old4OtherAd", the 2-cycles-before adjacent signal value "Old2OtherAd" is substituted in the 3-cycles-before adjacent signal value "Old3OtherAd", the 1-cycle-before adjacent signal value "Old1OtherAd" is substituted in the 2-cycles-before adjacent signal value "Old2OtherAd", and the current-cycle adjacent signal value "OtherAd" is substituted in the 1-cycle-before adjacent signal value "Old1OtherAd". Thereafter, the processing flow returns to step SA2.

In a case where the determination in step SA4 is that the status is not "OutOff_InOff", the processing flow proceeds to step SA12, in which a determination is performed as to whether the status is "OutOff_InOn". In a case where the determination in step SA12 is that the status is "OutOff_InOn", the processing flow proceeds to step SA13, in which a determination is performed as to whether the main signal value "MainAd" is smaller than the first threshold value TH1. In a case where the determination indicates that the main signal value "MainAd" turns out to be smaller than the first threshold value TH1, the processing flow proceeds to step SA14, in which the status is changed to "OutOff_InOff". Thereafter, the processing flow proceeds to step SA8.

On the other hand, in a case where it is determined in step SA13 that the main signal value "MainAd" is greater than or equal to the first threshold value TH1, the processing flow proceeds to step SA15, in which a determination is performed as to whether or not the adjacent integration value "sumOtherAd" is greater than or equal to second threshold value TH2. In a case where the determination indicates that the adjacent integration value "sumOtherAd" is greater than or equal to the second threshold value, the processing flow proceeds to step SA16, in which the status is changed to "OutOn" and the 4-cycles-before adjacent signal value is initialized to 0. Thereafter, the processing flow proceeds to step SA8.

On the other hand, in a case where it is determined in step SA15 that the adjacent integration value "sumOtherAd" is smaller than the second threshold value TH2, the processing flow proceeds to step SA17, in which a determination is performed as to whether or not the current-cycle value "Cycle" is greater than or equal to a predetermined criterion cycle value. That is, a determination is performed as to whether the predetermined integration period has elapsed since the main signal "MainAd" is determined to be greater than or equal to the first threshold value TH1. In a case where the determination indicates that the current-cycle value "Cycle" is equal to or greater than the criterion cycle value (the predetermined integration period), it is determined that the integration period has elapsed, and the processing flow proceeds to step SA18, in which the status is changed to "OutOff_InErr", and the 4-cycles-before adjacent signal value is initialized to 0. Thereafter, the processing flow proceeds to step SA8. On the other hand, in a case where it is determined in step SA17 that the current cycle value "Cycle" is smaller than the criterion cycle value, that is, in a case where the predetermined integration period has not yet elapsed since the main signal "MainAd" is determined to be greater than or equal to the first threshold value TH1, the processing flow proceeds to step SA19, in which the adjacent signal value "OtherAd" is added to the current adjacent integration value "sumOtherAd", and the cycle value "Cycle" is incremented by 1. Thereafter, the processing flow proceeds to step SA8.

In a case where it is determined in step SA12 that the status is not "OutOff_InOn", the processing flow proceeds to step SA20, in which a determination is performed as to whether the main signal value "MainAd" is smaller than the first threshold value TH1. In a case where the determination indicates that the main signal value "MainAd" is greater than or equal to the first threshold value TH1, the processing flow directly proceeds to step SA8. However, in a case where the main signal value "MainAd" is lower than the first threshold value TH1, the processing flow proceeds to step SA21 and the status is changed to "OutOff_InOff". Thereafter, the processing flow proceeds to step SA8.

Figure 10:
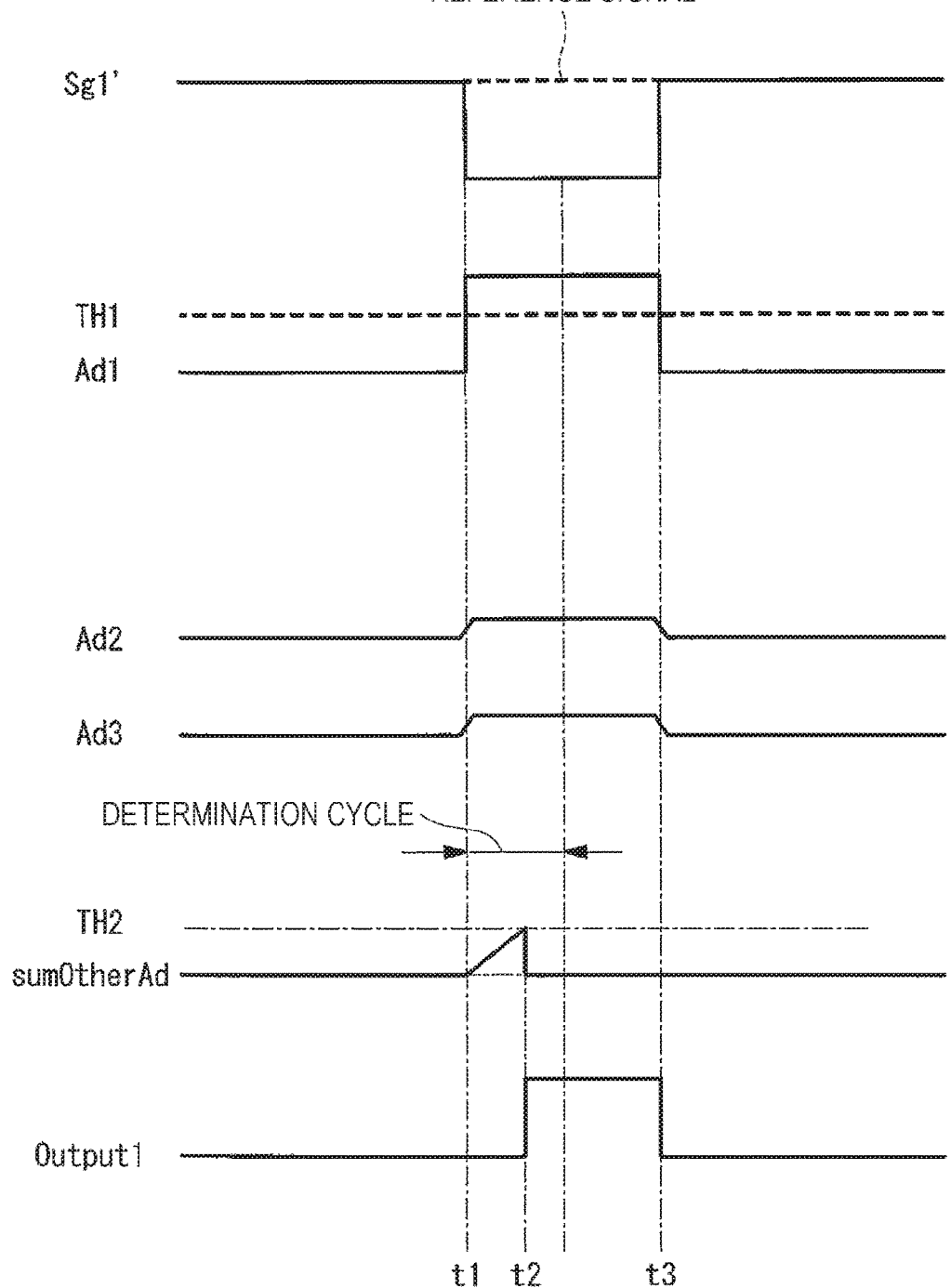
FIG. 10 is a diagram illustrating examples of input signals and output signals in a situation in which an operation object comes in a proximity of an electrode.

Next, an input detection process is described below for a case where input signals Ad1, Ad2, and Ad3 such as those shown in FIG. 10 occur owing to an operation object coming in the proximity of the electrode 1a. First, the loop from step SA2 to step SA11 shown in FIG. 8 is performed repeatedly until time t1 shown in FIG. 10 is reached. At time t1 shown in FIG. 10, when the input signal Ad1 rises up to a value equal to or higher than the first threshold value TH1, it is determined as "YES" in step SA6 in FIG. 8, and thus the processing flow proceeds to step SA7, in which the status is changed to "OutOff_InOn", and integrating of the adjacent signal value is started.

Subsequently, via steps SA8, SA10, and SA11, a next cycle is started. In the next cycle, because the status is in "OutOff_InOn", it is determined as "NO" in step SA4 and it is determined as "YES" in the following step SA12. After that, a loop including steps SA12, SA13, SA15, SA17, SA19, SA8, SA10, SA11, SA2, SA3, and SA4 is performed repeatedly until one of the following conditions is satisfied: the main signal value "MainAd" becomes smaller than the first threshold value ("YES" in step SA13); the adjacent integration value "sumOtherAd" becomes greater than or equal to the second threshold value ("YES" in step SA15); or the cycle value "Cycle" becomes greater than the criterion cycle value ("YES" in step SA17).

Thereafter, at time t2 in FIG. 10, when the adjacent integration value "sumOtherAd" becomes greater than or equal to the second threshold value, the determination in step SA15 is "YES", the status is changed to "OutOn" in step SA16, and 4-cycles-before adjacent signal value is initialized to 0. As a result, the determination in step SA8 as "YES", and the output "Output" is changed to "On" in step SA9. Thus, at time t2, the output of Output1 changes to "On" as shown in FIG. 10.

From the next cycle, because the status is "OutOn", the loop including steps SA2, SA3, SA4, SA12, SA20, SA8, SA9, and SA11 is performed repeatedly. When, at time t3 in FIG. 10, the main signal value "MainAd" becomes smaller than the first threshold value, the determination in step SA20 becomes "YES", and the processing flow proceeds to step SA21, in which the status is changed to "OutOff_InOff". Thus, the following step SA8 is determined as "NO", and in step SA10, the output is changed to "Output=Off". As a result, at time t3, the output "Output" changes to "Off" as shown in FIG. 10.

As described above, when an operation object comes in the proximity of the electrode 1a, the main signal value "MainAd" becomes greater than or equal to the first threshold value, and then the adjacent integration value "sumOtherAd" in the predetermined integration period becomes greater than or equal to the second threshold value, and thus the operation object in the proximity is detected.

Next, an input detection process is described below for a case where input signals Ad1, Ad2, and Ad3 such as those shown in FIG. 11 occur owing to noise due to an external factor.

Figure 11:
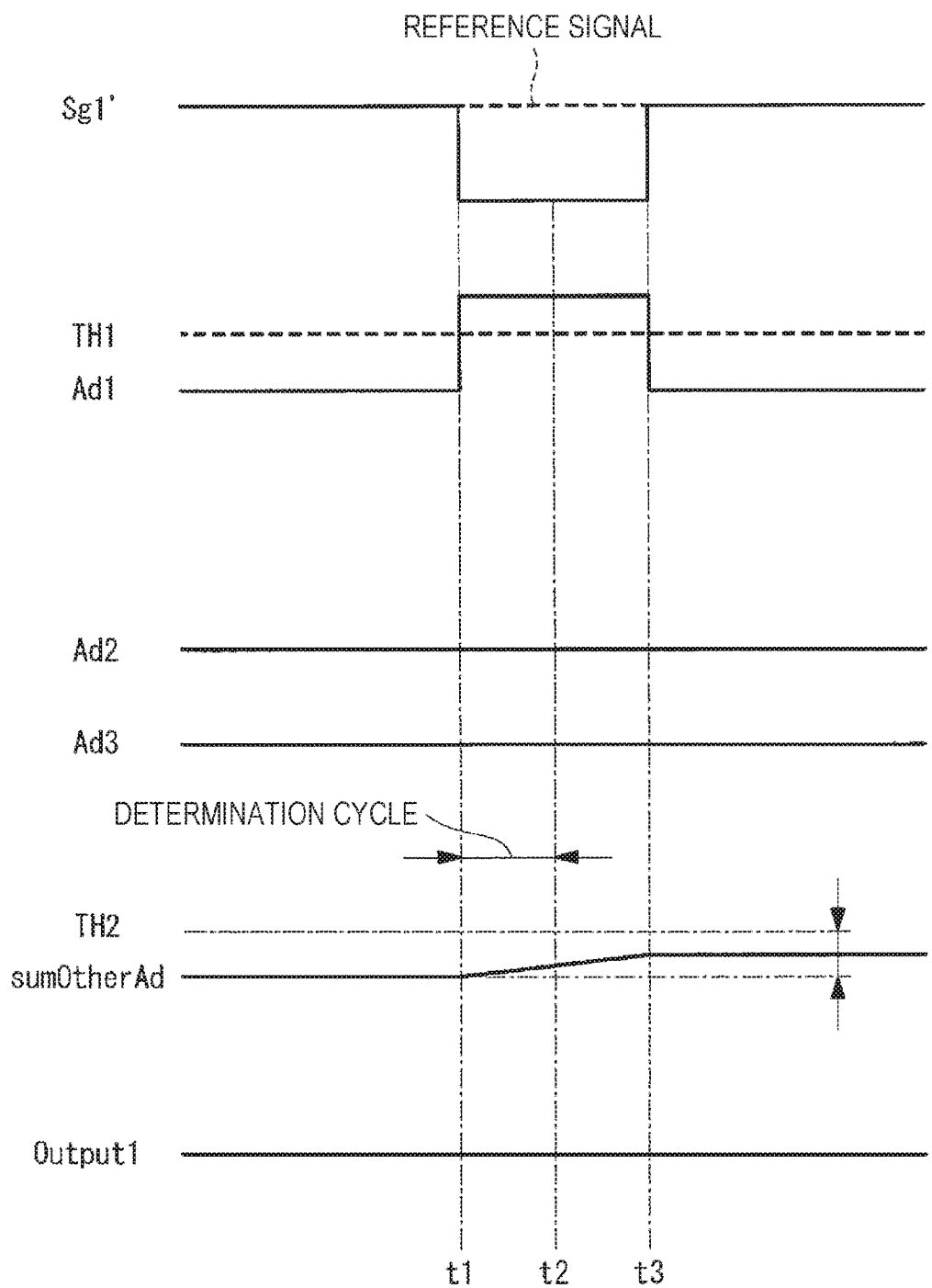
FIG. 11 is a diagram illustrating examples of input signals and output signals in a situation in which a change in capacitance of an electrode occurs owing to noise.

First, the loop from step SA2 to step SA11 shown in FIG. 8 is performed repeatedly until time t1 shown in FIG. 11 is reached. At time t1 shown in FIG. 11, when the input signal Ad1 rises up to a value equal to or higher than the first threshold value TH1, it is determined as "YES" in step SA6 in FIG. 8, the status is changed to "OutOff_InOn" in step SA7, and integrating of the adjacent signal value is started.

Subsequently, via steps SA8, SA10, and SA11, a next cycle is started. In the next cycle, because the status is in "OutOff_InOn", it is determined as "NO" in step SA4 and it is determined as "YES" in the following step SA12. After that, the loop including steps SA12, SA13, SA15, SA17, SA19, SA8, SA10, SA11, SA2, SA3, and SA4 is performed repeatedly until one of the following conditions is satisfied: the main signal value "MainAd" becomes smaller than the first threshold value ("YES" in step SA13); the adjacent integration value "sumOtherAd" becomes greater than or equal to the second threshold value ("YES" in step SA15); or the cycle value "Cycle" becomes greater than the criterion cycle value ("YES" in step SA17).

Thereafter, at time t2 in FIG. 11, when the integration period after the main signal value "MainAd" is detected to be greater than or equal to the first threshold value becomes greater than a predetermined value, and thus the cycle value "Cycle" becomes greater than the criterion cycle value, it is determined in step SA17 as "YES", and the status is changed to "OutOff_InErr" in step SA18. That is, it is determined that the main signal value "MainAd" input at this time is caused by an error. Subsequently, in this status, via steps SA8 to SA11, a next cycle is started.

In the next cycle, because the status is in "OutOff_InErr", it is determined as "NO" in step SA4 and step SA12, and the processing flow proceeds to step SA20. After that, the loop including steps SA8, SA10, SA11, SA2 to SA4, SA12, and SA20 is performed repeatedly until the input signal Ad1 becomes smaller than the first threshold value. When, at time t3 in FIG. 11, the input signal Ad1 becomes smaller than the first threshold value TH1, step SA20 is determined as "YES", and, in the following step SA21, the status is chanted to "OutOff_InOff".

As described above, in a case where a change in capacitance of the electrode 1a occurs owing to external noise, the adjacent integration value "sumOtherAd" does not reach the second threshold value within the predetermined integration period after the main signal value "MainAd" becomes greater than or equal to the first threshold value, and thus it is determined that the input occurs owing to an error, which makes it possible to prevent an erroneous detection due to noise.

FIG. 12 is a diagram illustrating erroneous detection avoidance rates for various values of the second threshold value TH2 and various values of the integration period in the input detection process described above. From the result shown in FIG. 12, it can be seen that a high erroneous detection avoidance rate is achieved when the criterion cycle value (integration period) is set to be relatively long and the second threshold value TH2 is accordingly set to be relatively high. From this result, for example, the criterion cycle value (the integration period) may be set in a range from 120 milliseconds (inclusive) to 400 milliseconds (inclusive), and the second threshold value may be set in a range from 5 (inclusive) to 20 (inclusive). More preferably, the criterion cycle value (the integration period) may be set in a range from 120 milliseconds (inclusive) to 400 milliseconds (inclusive), and the second threshold value may be set in a range from 10 counts (inclusive) to 20 counts (inclusive). Note that the ranges described above are merely examples, and the ranges may vary depending on the sensitivity of the sensor, the environment in which the sensor is installed, the state in which the sensor is used, or the like. Therefore, it may be preferable to perform a test using a real apparatus or perform a simulation to set the second threshold value and the integration period in proper ranges in which a desirable low erroneous detection avoidance rate is achieved.

In the input apparatus, the input detection method, and the in-vehicle apparatus according to the embodiment, as described above, in a case where a large change occurs in capacitance of one of the electrodes 1a, 1b, and 1c, the determination as to whether an operation object has come in the proximity of the input apparatus is performed also using a change in capacitance of other electrodes disposed adjacent to the one of the electrodes, and thus it becomes possible reduce an erroneous detection due to noise with a simple configuration.

In the embodiments described above, it is assumed by way of example that the input apparatus 10 includes three electrodes. However, the number of electrodes included in the input apparatus 10 is not limited to three as long as the number of electrodes is greater than or equal to two. In the embodiments described above, it is assumed by way of example that the electrodes 1a to 1c are provided for the respective corresponding operation buttons (operation input units) for operating various in-vehicle devices. However, each electrode does not necessarily need to correspond to an operation button. For example, for the case of an electrode disposed close to a second electrode disposed for an operation button, the electrode may be an electrode used only for detecting an operation object coming in the proximity of the second electrode corresponding to the operation button. In this case, the come-in-proximity determination unit may be provided for the second electrode corresponding to the operation button.

The present invention is not limited to the embodiments described above, but various modifications are possible without departing from the sprit and the scope of the invention.

What is claimed is:

1. An input apparatus to be operated by an operation object, the input apparatus comprising:
   a plurality of electrodes disposed so as to be spaced apart from each other, each electrode having a capacitance which changes in accordance with proximity of the operation object to the electrode;
   a signal processing unit configured to generate an input signal for each electrode based on a change in the capacitance of the electrode; and
   a determination unit configured to receive the input signal of each electrode and determine whether the operation object has come into proximity of at least one of the plurality of electrodes based on a plurality of the input signals output from the signal processing unit,
   wherein the determination unit determines that the operation object has come into the proximity of a first electrode among the plurality of electrodes if one of the plurality of input signals corresponding to the first electrode is greater than or equal to a first threshold value, and an integral value of remaining input signals corresponding to remaining electrodes of the plurality of electrodes for a predetermined integration period is greater than or equal to a second threshold value,
   and wherein the determination unit includes a plurality of proximity determination units corresponding to the plurality of electrodes, each proximity determination unit including:
      a first determination unit configured to determine whether the input signal of corresponding one of the electrodes is greater than or equal to the first threshold value;
      an integral operation unit configured to generate the integral value by integrating remaining input signals corresponding to remaining electrodes other than the corresponding electrode for the predetermined integration period; and
      a second determination unit configured to determine that the operation object has come in proximity of the corresponding electrode if the first determination unit determines that the input signal of the corresponding electrode is greater than or equal to the first threshold value, and if the integral value generated by the integral operation unit is greater than or equal to the second threshold value.

2. The input apparatus according to claim 1, wherein the integral operation unit continuously performs the integration for the integration period regardless of whether or not the input signal of the corresponding electrode is greater than or equal to the first threshold value.

3. An in-vehicle apparatus comprising the input apparatus according to claim 1.

4. The input apparatus according to claim 1, wherein the integral operation unit accumulates a sum of signal values of the remaining input signals corresponding to the remaining electrodes for a predetermined number of cycles so as to generate the integral value.

* * * * *